United States Patent
Gandhi et al.

(10) Patent No.: US 12,170,324 B2
(45) Date of Patent: *Dec. 17, 2024

(54) TRANSISTORS AND ARRAYS OF ELEVATIONALLY-EXTENDING STRINGS OF MEMORY CELLS

(71) Applicant: Lodestar Licensing Group LLC, Evanston, IL (US)

(72) Inventors: Ramanathan Gandhi, Boise, ID (US); Augusto Benvenuti, Lallio (IT); Giovanni Maria Paolucci, Milan (IT)

(*) Notice: Subject to any disclaimer, the term of this patent is extended or adjusted under 35 U.S.C. 154(b) by 0 days.

This patent is subject to a terminal disclaimer.

(21) Appl. No.: 17/987,779

(22) Filed: Nov. 15, 2022

(65) Prior Publication Data

US 2023/0075673 A1   Mar. 9, 2023

Related U.S. Application Data

(63) Continuation of application No. 17/182,808, filed on Feb. 23, 2021, now Pat. No. 11,538,919.

(51) Int. Cl.
*H01L 29/51* (2006.01)

(52) U.S. Cl.
CPC .......... *H01L 29/517* (2013.01); *H01L 29/513* (2013.01)

(58) Field of Classification Search
CPC .............................. H01L 29/517; H01L 29/513
See application file for complete search history.

(56) References Cited

U.S. PATENT DOCUMENTS

| 5,065,222 | A  | 11/1991 | Ishii |
| 5,990,516 | A  | 11/1999 | Momose et al. |
| 7,668,010 | B2 | 2/2010  | Ku et al. |
| 7,889,556 | B2 | 2/2011  | Ku et al. |
| 7,923,364 | B2 | 4/2011  | Goda |
| 8,441,855 | B2 | 5/2013  | Liu |
| 8,681,555 | B2 | 3/2014  | Liu |

(Continued)

FOREIGN PATENT DOCUMENTS

| CN | 101521205 | 9/2009 |
| EP | 2423963   | 2/2012 |

(Continued)

OTHER PUBLICATIONS

CN CN201880046100.4 Search Rept., Dec. 19, 2022, Micron Technology, Inc.

(Continued)

*Primary Examiner* — Mohammad M Choudhry
(74) *Attorney, Agent, or Firm* — Brooks, Cameron & Huebsch, PLLC

(57) ABSTRACT

A transistor comprises a channel region having a frontside and a backside. A gate is adjacent the frontside of the channel region with a gate insulator being between the gate and the channel region. Insulating material having net negative charge is adjacent the backside of the channel region. The insulating material comprises at least one of $Al_xF_y$, $HfAl_xF_y$, $AlO_xN_y$, and $HfAl_xO_yN_z$, where "x", "y", and "z" are each greater than zero. Other embodiments and aspects are disclosed.

19 Claims, 7 Drawing Sheets

(56) References Cited

U.S. PATENT DOCUMENTS

| | | |
|---|---|---|
| 8,792,280 B2 | 7/2014 | Liu |
| 8,987,091 B2 | 3/2015 | Then et al. |
| 9,036,421 B2 | 5/2015 | Liu |
| 9,070,481 B1 | 6/2015 | Ellis |
| 9,171,948 B2 | 10/2015 | Mori |
| 9,209,290 B2 | 12/2015 | Then et al. |
| 9,230,984 B1 | 1/2016 | Takeguchi |
| 9,245,957 B2 | 1/2016 | Kim et al. |
| 9,257,552 B2 | 2/2016 | Mizushima |
| 9,306,027 B2 | 4/2016 | Inoue et al. |
| 9,343,534 B2 | 5/2016 | Kim et al. |
| 9,478,558 B2 | 10/2016 | Koka et al. |
| 9,530,878 B2 | 12/2016 | Then et al. |
| 9,741,737 B1 | 8/2017 | Huang et al. |
| 9,755,062 B2 | 9/2017 | Then et al. |
| 9,985,098 B2 | 5/2018 | Matsumoto et al. |
| 9,997,532 B2 | 6/2018 | Ko et al. |
| 10,014,311 B2 | 7/2018 | Pavlopoulos et al. |
| 10,192,878 B1 | 1/2019 | Tsutsumi et al. |
| 10,297,611 B1 | 5/2019 | Wells et al. |
| 10,446,681 B2 | 10/2019 | Carlson et al. |
| 10,559,466 B2 | 2/2020 | Wells et al. |
| 2002/0055016 A1 | 5/2002 | Hiramoto et al. |
| 2004/0001140 A1 | 1/2004 | Murayama |
| 2004/0087093 A1 | 5/2004 | Fukuda et al. |
| 2005/0176219 A1 | 8/2005 | Kim et al. |
| 2006/0252281 A1 | 11/2006 | Park et al. |
| 2006/0289953 A1 | 12/2006 | Sakuma et al. |
| 2007/0082433 A1 | 4/2007 | Yang et al. |
| 2007/0218663 A1 | 9/2007 | Hao et al. |
| 2008/0150003 A1 | 6/2008 | Chen et al. |
| 2009/0061613 A1 | 3/2009 | Choi et al. |
| 2009/0213656 A1 | 8/2009 | Ku et al. |
| 2009/0309171 A1 | 12/2009 | Schrank |
| 2010/0012949 A1 | 1/2010 | Soukiassian |
| 2010/0140709 A1 | 6/2010 | Mouli |
| 2010/0148171 A1 | 6/2010 | Hayashi et al. |
| 2010/0301340 A1* | 12/2010 | Shih .................. H01L 29/4908 |
| | | 257/E29.294 |
| 2011/0003467 A1 | 1/2011 | Kanda |
| 2011/0210353 A1 | 9/2011 | Ren |
| 2012/0049145 A1 | 3/2012 | Lee et al. |
| 2012/0063198 A1 | 3/2012 | Liu |
| 2012/0132904 A1 | 5/2012 | Yamazaki |
| 2012/0286349 A1 | 11/2012 | Tan |
| 2012/0309144 A1 | 12/2012 | Do et al. |
| 2013/0248977 A1 | 9/2013 | Mori et al. |
| 2013/0270621 A1 | 10/2013 | Mori |
| 2013/0270631 A1 | 10/2013 | Kim |
| 2013/0271208 A1 | 10/2013 | Then et al. |
| 2013/0309808 A1 | 11/2013 | Zhang et al. |
| 2014/0027764 A1 | 1/2014 | Yamazaki et al. |
| 2014/0151690 A1 | 6/2014 | Kim et al. |
| 2014/0152936 A1 | 6/2014 | Kim et al. |
| 2014/0160850 A1 | 6/2014 | Liu |
| 2014/0175530 A1 | 6/2014 | Chien |
| 2014/0367762 A1* | 12/2014 | Tian ...................... H10B 43/35 |
| | | 438/264 |
| 2015/0014813 A1 | 1/2015 | Mueller et al. |
| 2015/0056797 A1 | 2/2015 | Kim et al. |
| 2015/0060998 A1 | 3/2015 | Mizushima |
| 2015/0145004 A1 | 5/2015 | Inoue et al. |
| 2015/0162385 A1 | 6/2015 | Dittmar et al. |
| 2015/0171205 A1 | 6/2015 | Then et al. |
| 2015/0194478 A1 | 7/2015 | Antonov et al. |
| 2015/0221774 A1 | 8/2015 | Yamazaki et al. |
| 2015/0236038 A1 | 8/2015 | Pachamuthu et al. |
| 2015/0249013 A1 | 9/2015 | Arghavani et al. |
| 2015/0263074 A1 | 9/2015 | Takaki |
| 2016/0093631 A1 | 3/2016 | Yun et al. |
| 2016/0111434 A1 | 4/2016 | Pachamuthu et al. |
| 2016/0118396 A1 | 4/2016 | Rabkin et al. |
| 2016/0189797 A1 | 6/2016 | Yamamoto |
| 2016/0233328 A1 | 8/2016 | Cheng |
| 2016/0268431 A1 | 9/2016 | Moll et al. |
| 2016/0293621 A1 | 10/2016 | Huang et al. |
| 2016/0343868 A1 | 11/2016 | Koezuka et al. |
| 2016/0351576 A1 | 12/2016 | Yamazaki et al. |
| 2016/0372327 A1 | 12/2016 | Ventzek et al. |
| 2017/0005200 A1 | 1/2017 | Sasaki |
| 2017/0012051 A1 | 1/2017 | Lee et al. |
| 2017/0062456 A1 | 3/2017 | Sugino et al. |
| 2017/0077125 A1 | 3/2017 | Yamasaki et al. |
| 2017/0110470 A1 | 4/2017 | Rabkin et al. |
| 2017/0125536 A1 | 5/2017 | Chen et al. |
| 2017/0168742 A1 | 6/2017 | Nam et al. |
| 2017/0178923 A1 | 6/2017 | Surla et al. |
| 2017/0330752 A1 | 11/2017 | Kim et al. |
| 2018/0082892 A1 | 3/2018 | Lee et al. |
| 2018/0122907 A1 | 5/2018 | Choi et al. |
| 2018/0175050 A1 | 6/2018 | Son et al. |
| 2018/0204849 A1 | 7/2018 | Carlson et al. |
| 2018/0277560 A1 | 9/2018 | Zushi et al. |
| 2019/0013404 A1 | 1/2019 | Carlson et al. |
| 2019/0198320 A1 | 6/2019 | Wells et al. |
| 2019/0280122 A1 | 9/2019 | Carlson et al. |
| 2020/0006566 A1* | 1/2020 | Chien .................. H01L 29/792 |
| 2021/0183876 A1 | 6/2021 | Sun et al. |
| 2022/0271127 A1 | 8/2022 | Gandhi et al. |

FOREIGN PATENT DOCUMENTS

| | | |
|---|---|---|
| EP | 2879183 | 6/2015 |
| EP | 18831466 | 5/2020 |
| EP | 18894316 | 11/2020 |
| JP | 62-298158 | 12/1987 |
| JP | 63-174348 | 7/1988 |
| JP | H 02-110930 | 4/1990 |
| JP | 04-010351 | 1/1992 |
| JP | 04-109623 | 4/1992 |
| JP | H 05-74627 | 3/1993 |
| JP | 06-288902 | 10/1994 |
| JP | 2001-168305 | 6/2001 |
| JP | 2012-004397 | 1/2012 |
| JP | 2013-201270 | 10/2013 |
| JP | 2013-222785 | 10/2013 |
| JP | 2015-053336 | 3/2015 |
| JP | 2016-225614 | 12/2016 |
| JP | 2017-050527 | 3/2017 |
| KR | 10-2011-0119156 | 11/2011 |
| KR | 10-2013-0116116 | 10/2013 |
| KR | 10-2016-0087479 | 7/2016 |
| KR | 10-2017-0127785 | 11/2017 |
| TW | 201236112 | 9/2012 |
| TW | 201428980 | 7/2014 |
| TW | 201721921 | 6/2017 |
| TW | 201724269 | 7/2017 |
| TW | 107122930 | 2/2019 |
| WO | WO 2010/080318 | 7/2010 |
| WO | WO 2016/053623 | 4/2016 |
| WO | PCT/US2018/038826 | 1/2020 |
| WO | PCT/US2018/065437 | 6/2020 |
| WO | WO PCT/US2018/065462 | 6/2020 |

OTHER PUBLICATIONS

WO PCT/US2018/038826 Search Rept., Nov. 2, 2018, Micron Technology, Inc.
WO PCT/US2018/038826 Writ. Opin., Nov. 2, 2018, Micron Technology, Inc.
WO PCT/US2018/065437 Search Rept., Apr. 12, 2019, Micron Technology, Inc.
WO PCT/US2018/065437 Writ. Opin., Apr. 12, 2019, Micron Technology, Inc.
WO PCT/US2018/065462 Search Rept., Apr. 16, 2019, Micron Technology, Inc.
WO PCT/US2018/065462 Writ. Opin., Apr. 16, 2019, Micron Technology, Inc.
Bedia et al., "Influence of the Thickness on Optical Properties of Sprayed ZnO Hole-Blocking Layers Dedicated to Inverted Organic

(56) References Cited

OTHER PUBLICATIONS

Solar Cells", Energy Procedia 50, 2014, United Kingdom, pp. 603-609.
Dicks et al., "The Origin of Negative Charging in Amorphous Al2O3 Films: The Role of Native Defects", Nanotechnology 30, United Kingdom, 2019, 14 pages.
Diffusion, Lecture Notes No. 9, MIT Open Course, pp. 1-16.
Hsiao et al., "A Critical Examination of 3D Stackable NAND Flash Memory Architectures by Simulation Study of the Scaling Capability", IEEE International Memory Workshop, 2010, United States, 4 pages.
Hyeon et al., "Electrical Characterization of Charge Polarity in AlF3 Anti-Reflection Layers for Complementary Metal Oxide Semiconductor Image Sensors", Journal of Nanoscience and Nanotechnology vol. 18, 2018, United States, pp. 6005-6009.
Kim, "Tunnel Oxide Nitridation Effect on the Evolution of Vt Instabilities (RTS/QED) and Defect Characterization for Sub-40-nm Flash Memory", IEEE Electron Device Letters vol. 32, No. 8, Aug. 2011, United States, pp. 999-1001.
Konig et al., "Field Effect of Fixed Negative Charges on Oxidized Silicon Induced by AlF3 Layers with Fluorine Deficiency", Applied Surface Science 234, 2004, Netherlands, pp. 222-227.
Kuhnhold-Pospischil et al., "Activation Energy of Negative Fixed Charges in Thermal ALD Al2O3", Applied Physics Letters 109, 2016, United States, 4 pages.
Morin et al., "A Comparison of the Mechanical Stability of Silicon Nitride Films Deposited with Various Techniques", Applied Surface Science vol. 260, 2012, Netherlands, pp. 69-72.
CN CN201880076542.3 Search Rept., Feb. 17, 2023, Micron Technology, Inc.

\* cited by examiner

TRANSISTORS AND ARRAYS OF ELEVATIONALLY-EXTENDING STRINGS OF MEMORY CELLS

RELATED PATENT DATA

This patent resulted from a continuation of U.S. patent application Ser. No. 17/182,808 filed Feb. 23, 2021, which is hereby incorporated by reference herein.

TECHNICAL FIELD

Embodiments disclosed herein pertain to transistors and to arrays of elevationally-extending strings of memory cells.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated therefrom by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Field effect transistors are of course also used in integrated circuitry other than and/or outside of memory circuitry.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Transistors may be used in circuitry other than memory circuitry.

DETAILED DESCRIPTION OF EXAMPLE EMBODIMENTS

Embodiments of the invention encompass non-volatile transistors, semi-volatile transistors, and volatile transistors (e.g., volatile transistors that are devoid of any charge-storage material). Embodiments of the invention also encompass memory cells, including arrays of elevationally-extending strings of memory cells, for example strings of NAND memory cells.

Figure 2:
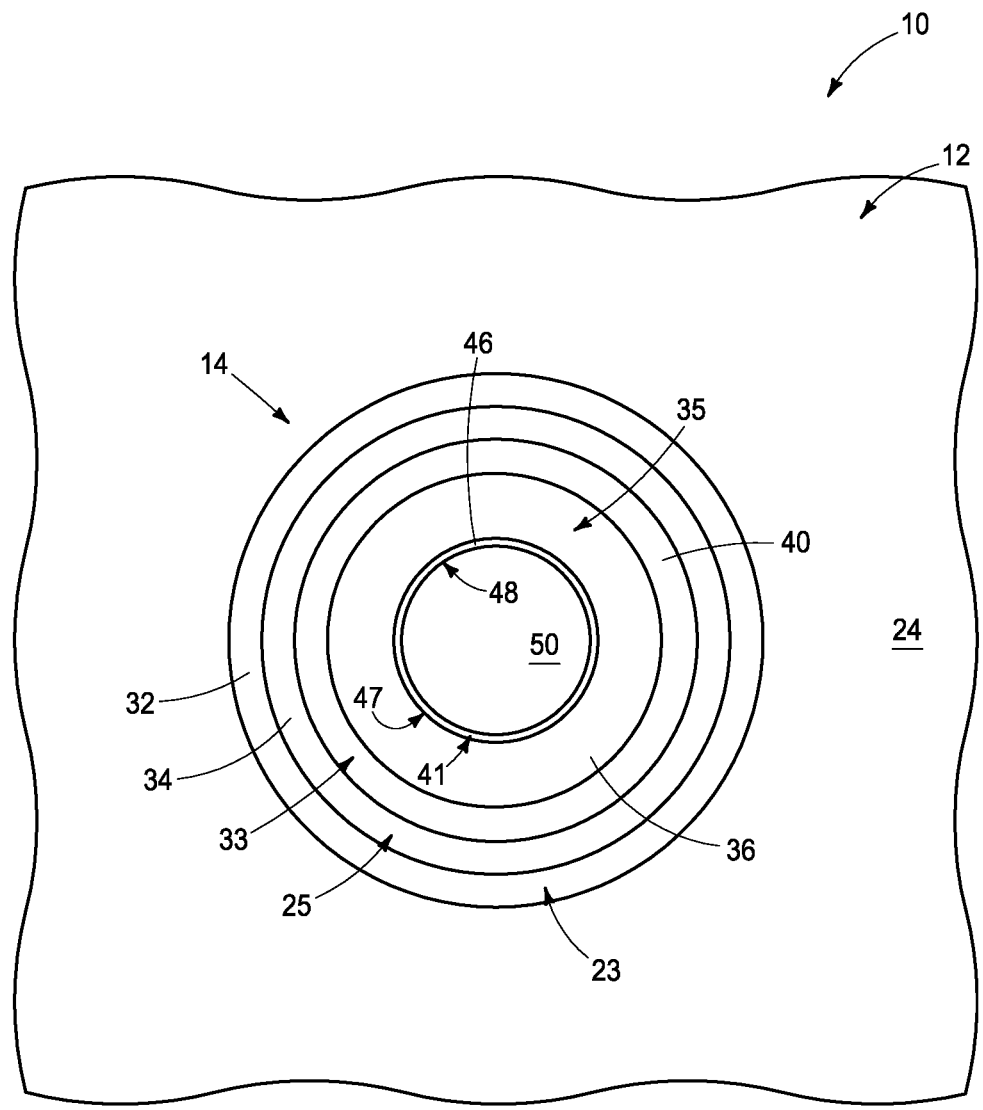
FIG. 2 is a cross-sectional view taken through line 2-2 in FIG. 1.
Figure 3:
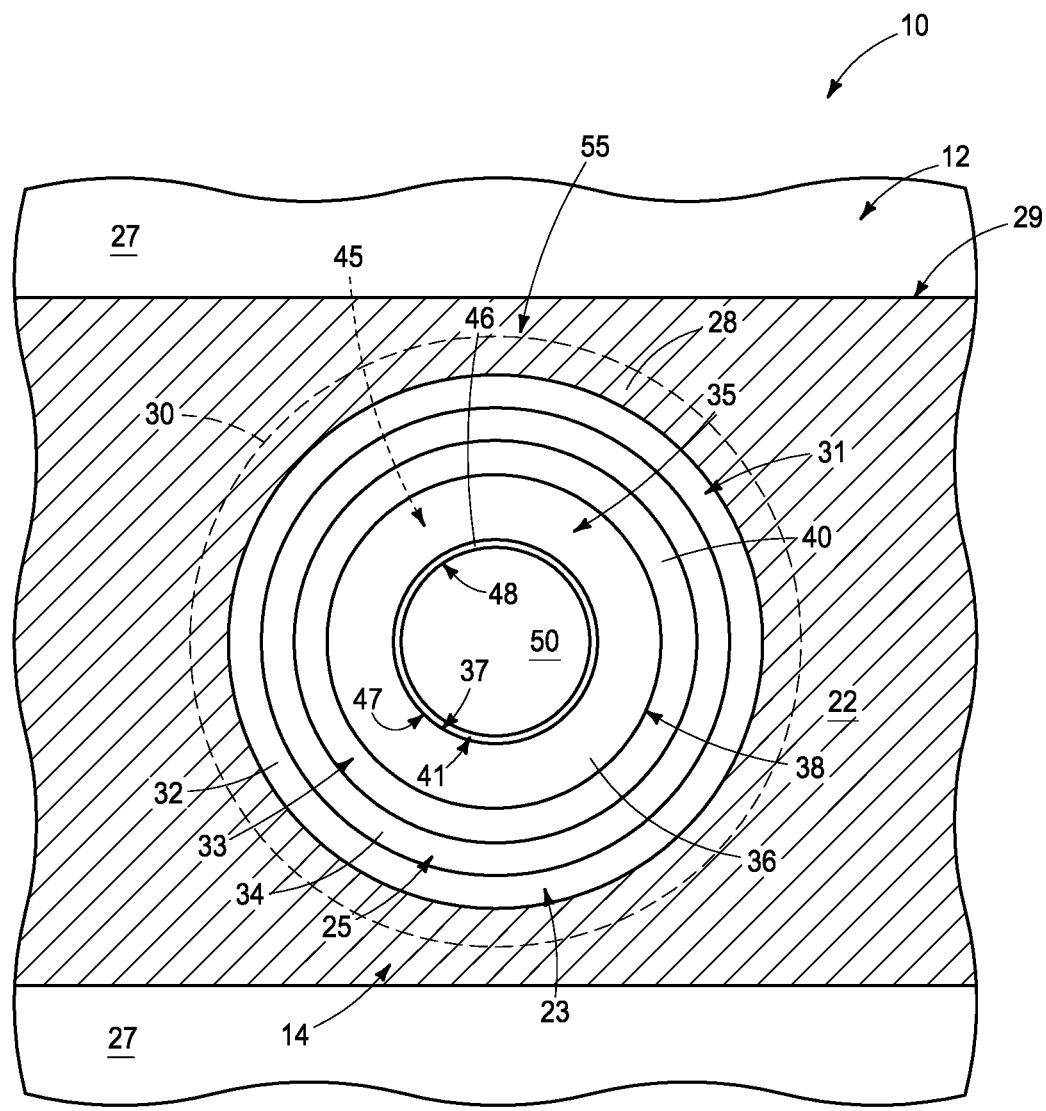
FIG. 3 is a cross-sectional view taken through line 3-3 in FIG. 1.

First example embodiments of an array of elevationally-extending strings of memory cells, also of individual transistors, are described with reference to FIGS. 1-3. A construction 10 comprises a base substrate 11 that may include any one or more of conductive/conductor/conducting (i.e., electrically herein), semiconductive/semiconductor/semi-conducting, or insulative/insulator/insulating (i.e., electrically herein) materials. Various materials have been formed elevationally over base substrate 11. Materials may be aside, elevationally inward, or elevationally outward of the FIGS. 1-3-depicted materials. For example, other partially or wholly fabricated components of integrated circuitry may be provided somewhere above, about, or within base substrate 11. Control and/or other peripheral circuitry for operating components within an array of transistors may also be fabricated, and may or may not be wholly or partially within a transistor array or sub-array. Further, multiple sub-arrays may also be fabricated and operated independently, in tandem, or otherwise relative one another. In this document, a "sub-array" may also be considered as an array.

Construction 10 comprises an array 12 of elevationally-extending strings 14 of memory cells 30. Only a single string 14 is shown, with likely hundreds, thousands, tens of thousands, etc. of such strings being included in array 12. Array 12 comprises a vertical stack 16 of alternating insulative tiers 18 and conductive tiers 20 (e.g., wordline tiers). Example tiers 20 comprise conductive material 22. Examples include elemental metals (e.g., tungsten, titanium, copper, etc.), metal material (e.g., metal nitrides, metal silicides, metal carbides, etc.), and conductively-doped-semiconductive materials (e.g., silicon, gallium, etc.), including mixtures thereof. Example tiers 18 comprise insulative material 24 (e.g., doped or undoped silicon dioxide). Array 12 is shown as having seven vertically-alternating tiers 18, 20 in FIG. 1 although fewer or likely many more (e.g., dozens, hundreds, etc.) may be formed. Accordingly, more tiers 18 and 20 may be above and/or below the depicted tiers. Tiers 18 and 20 may be of any suitable vertical thickness(es) and may have the same or different vertical thickness(es) relative one another. As an example, tiers 18 and 20 may have respective thicknesses of about 10 nanometers (nm) to 300 nm.

Figure 1:
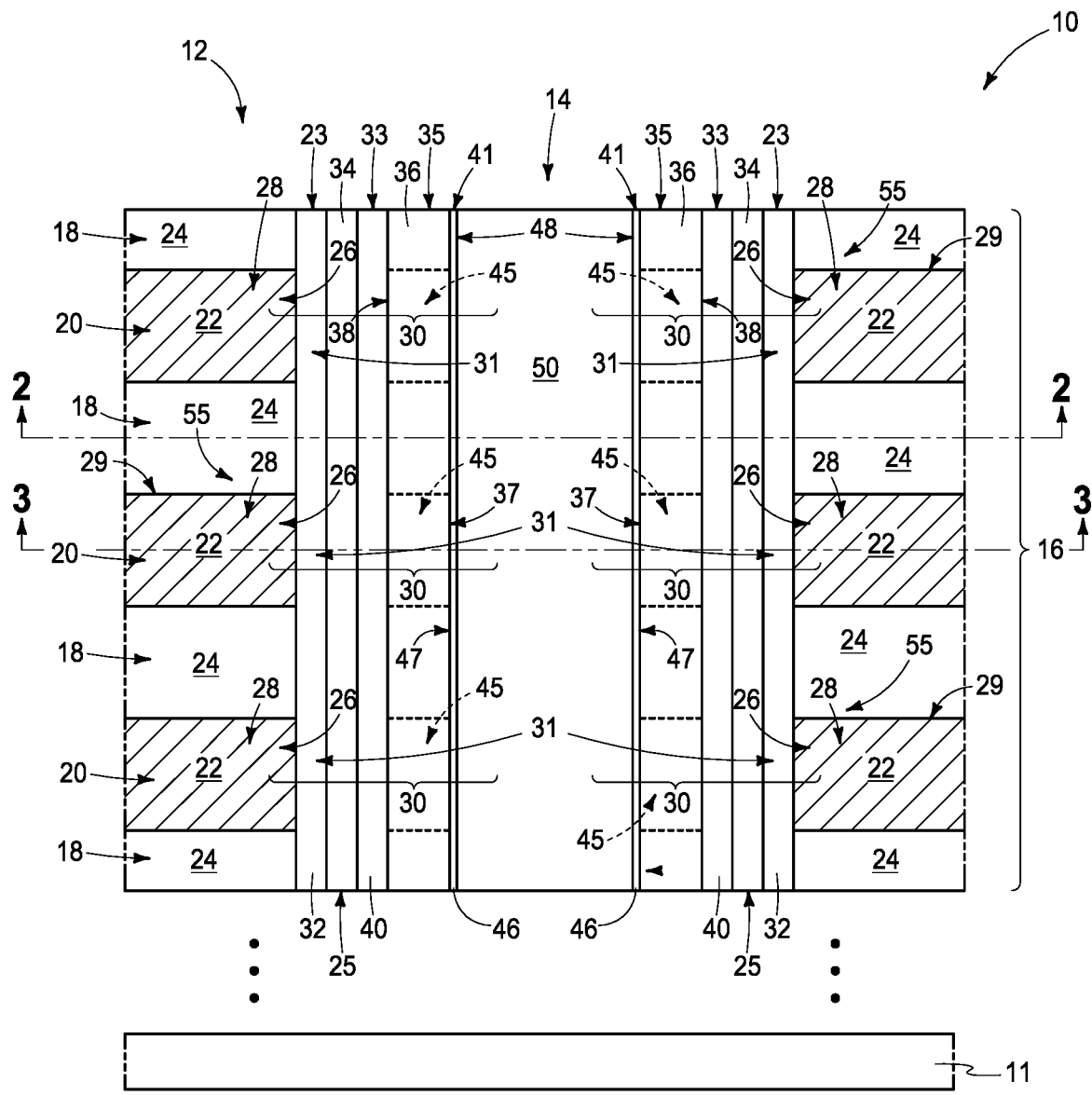
FIG. 1 is a diagrammatic cross-sectional view of a portion of an array of elevationally-extending strings of memory cells in accordance with an embodiment of the invention.

Conductive material 22 of conductive tiers 20 comprises terminal ends 26 in the depicted FIG. 1 cross-section that correspond to an individual control gates 28 of individual memory cells 30. Approximate locations of memory cells 30 are indicated with brackets in FIG. 1 and with a dashed outline in FIG. 3, with memory cells 30 being essentially ring-like or annular in the depicted example. Control gates 28 may be part of individual control-gate lines 29 (e.g., wordlines; only one being shown and numerically designated in FIG. 3) that interconnect multiple memory cells 30 of multiple strings 14 within individual conductive tiers 20 in a row direction. Dielectric material 27 (FIG. 3; e.g., silicon dioxide and/or silicon nitride) is laterally between control-gate lines 29. Alternate existing or future-developed constructions may be used. For example, multiple memory cells (not shown) may be formed about a single string 14 in an individual wordline tier 20, for example by bifurcating the FIG. 3-depicted control-gate line 29 longitudinally down its middle (not shown) thus creating two memory cells (not shown) that may be separately controlled if such bifurcated control-gate lines are separately controllable.

Individual memory cells 30 have a charge-blocking region 31 that extends elevationally along individual control gates 28 and charge-storage material 34 that extends elevationally along individual charge-blocking regions 31. A charge block may have the following functions in a memory cell: In a program mode, the charge block may prevent charge carriers from passing out of the charge-storage material (e.g., floating-gate material, charge-trapping material, etc.) toward the control gate, and in an erase mode the charge block may prevent charge carriers from flowing into the charge-storage material from the control gate. Accordingly, a charge block may function to block charge migration between the control-gate line and the charge-storage material of individual memory cells. An example charge-blocking region as shown comprises insulator material 32 (e.g., silicon dioxide and/or one or more high k materials, having an example thickness of 25 to 80 Angstroms). By way of further examples, a charge-blocking region may comprise a laterally (e.g., radially) outer portion of the charge-storage material (e.g., material 34) where such charge-storage material is insulative (e.g., in the absence of any different-composition material between an insulative-charge-storage material 34 and conductive material 22). Regardless, as an additional example, an interface of a charge-storage material and conductive material of a control gate may be sufficient to function as a charge-blocking region in the absence of any separate-composition-insulator material 32. Further, an interface of conductive material 22 with material 32 (when present) in combination with insulator material 32 may together function as a charge-blocking region, and as alternately or additionally may a laterally-outer region of an insulative-charge-storage material (e.g., a silicon nitride material 34).

Regardless, and in one embodiment, charge-blocking region 31 is formed from insulator material 32 that extends elevationally along stack 16 and in the form of a tube 23. In one embodiment, charge-storage material 34 extends elevationally along stack 16 and in the form of a tube 25. Charge-storage material 34 may comprise any suitable composition(s) and, in some embodiments, may comprise floating gate material (e.g., doped or undoped silicon) or charge-trapping material (e.g., silicon nitride, metal dots, etc.). In some embodiments, charge-storage material 34 may comprise, consist essentially of, or consist of silicon nitride. An example thickness is 50 to 80 Angstroms.

Individual memory cells 30 comprise a channel region 45 of individual transistors 55. An example thickness is 50 to 150 Angstroms. Channel region 45 has a backside 37 (e.g., a laterally-inner side or a radially-inner side) and a frontside 38 (e.g., a laterally-outer side or a radially-outer side). Sides 38 and 37 may be considered as first and second opposing sides 38 and 37, respectively. Control gate 28 is adjacent frontside 38 of channel region 45 (i.e., more so than relative to backside 37). Example channel region 45 comprises channel material 36. Example channel materials 36 include undoped or appropriately-doped crystalline semiconductor material, such as one or more of silicon, germanium and so-called Group III/V semiconductor materials (e.g., GaAs, InP, GaP and GaN). In one embodiment, channel regions 45 are individually n-type, yet in operation the current carriers are electrons (i.e., not holes as is typical with n-type channel regions). In another embodiment, channel regions 45 are individually p-type and the current carriers are electrons.

Charge-passage material 40 (e.g., a gate insulator) is laterally (e.g., radially) between channel region 45 and charge-storage material 34 (and between individual control gates 28 and individual channel regions 45). In one embodiment, charge-passage material 40 extends elevationally along stack 16 and in the form of a tube 33. Charge-passage material 40 may be, by way of example, a bandgap-engineered structure having nitrogen-containing material (e.g., silicon nitride) sandwiched between two insulator oxides (e.g., silicon dioxide). An example thickness is 25 to 80 Angstroms.

In one embodiment, construction 10 comprises insulating material 46 having first and second opposing sides 47 (frontside) and 48 (backside), respectively, and having net negative charge (i.e., total or overall charge that is negative at idle and at any operative state even though positive charges may also be present, and is also known by people of skill in the art as fixed negative charge density). In one embodiment, insulating material 46 extends elevationally along stack 16 and in the form of a tube 41. First side 47 of insulating material 46 is adjacent backside 37 (i.e., more so than is second side 48) of channel region 45. Insulating material 46 comprises at least one of $Al_xF_y$, $HfAl_xF_y$, $AlO_xN_y$, and $HfAl_xO_yN_z$, where "x", "y", and "z" are each greater than zero (e.g., and each is no more than 7 in each of $Al_xF_y$, $HfAl_xF_y$, $AlO_xN_y$, and $HfAl_xO_yN_z$). In one embodiment, insulating material 46 is directly against channel region 45 on its backside 37. In one embodiment, insulating material 46 comprises $Al_xF_y$, in one embodiment comprises $HfAl_xF_y$, in one embodiment comprises $AlO_xN_y$, and in one embodiment comprises $HfAl_xO_yN_z$. In one embodiment, insulating material 46 comprises at least two of, in one such embodiment at least three of, and in one embodiment each of $Al_xF_y$, $HfAl_xF_y$, $AlO_xN_y$, and $HfAl_xO_yN_z$. Example memory cell string 14 is shown as comprising a radially-central solid dielectric material 50 (e.g., spin-on-dielectric, silicon dioxide, and/or silicon nitride). Alternately, and by way of example only, the radially-central portion of memory cell string 14 may include void space(s) (not shown) or be devoid of solid material (not shown).

Materials/regions 28, 31, 34, 40, 45, 42, and 46 constitute an example embodiment of a transistor 55 in accordance with an embodiment of the invention, and which in such embodiment is a non-volatile programmable transistor comprising charge-storage material.

Any other attribute(s) or aspect(s) as shown and/or described herein with respect to other embodiments may be used in the embodiments shown and described with reference to the above embodiments.

Figure 4:
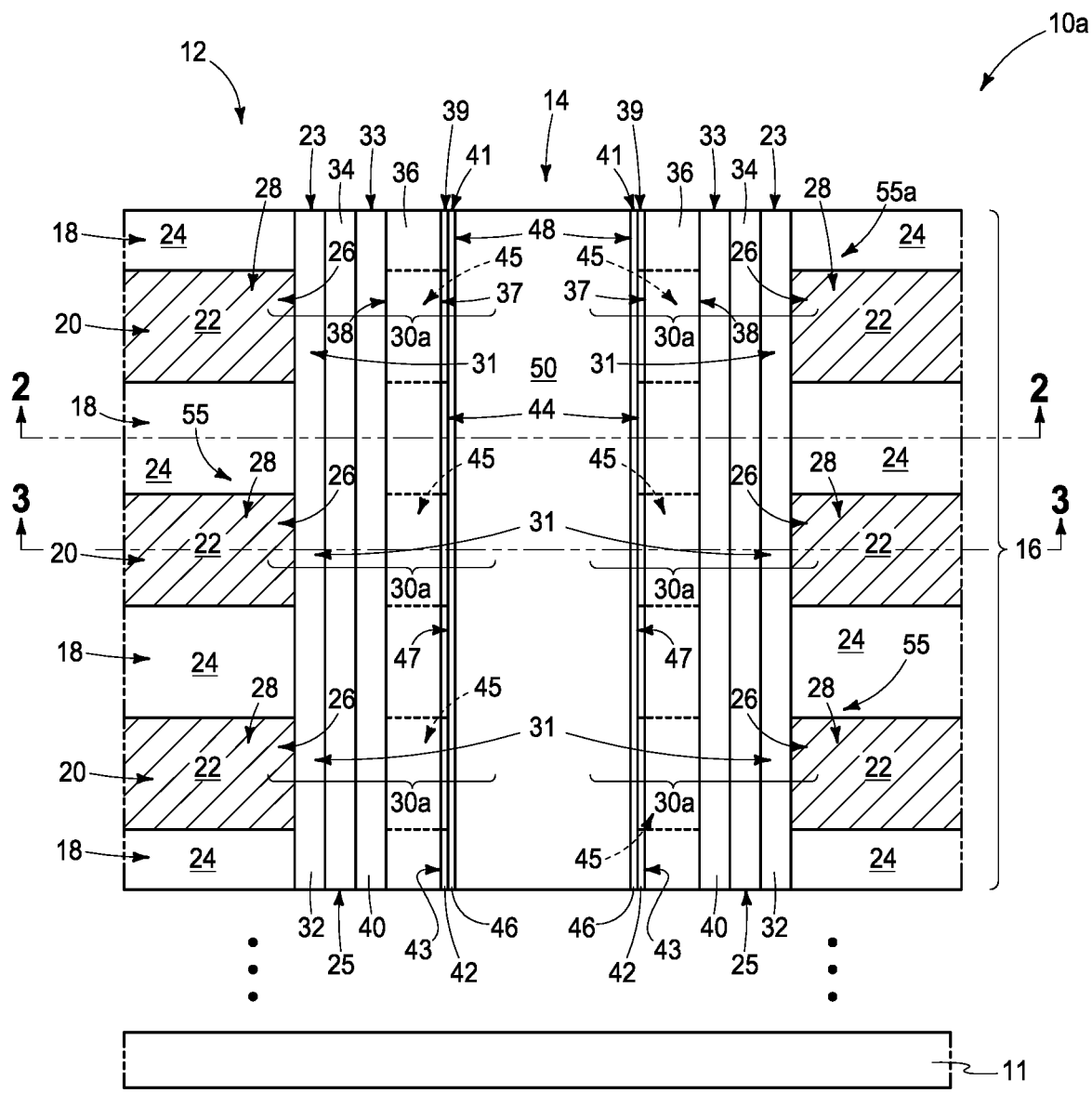
FIG. 4 is a diagrammatic cross-sectional view of a portion of an array of elevationally-extending strings of memory cells in accordance with an embodiment of the invention.

In one embodiment, insulating material 46 is not directly against channel region 45 on its backside 37, for example as shown in FIG. 4 with respect to a construction 10*a* illustrating another example embodiment memory array 12*a*. Like numerals from the above-described embodiments have been used where appropriate, with some construction differences being indicated with the suffix "a". Example memory cells 30*a* individually comprise a transistor 55*a*. In such embodiment, insulator material 42 of different composition from that of insulating material 46 is between insulating material 46 and backside 37 of channel region 45. In one such embodiment, insulator material 42 comprises at least one of a silicon oxide, silicon oxynitride, and $AlO_x$, where "x" is greater than zero (e.g., 0.15 to 7). Insulator material 42 may be considered as having first and second opposing sides 43 and 44, respectively, and in one embodiment extends elevationally along stack 16 and in the form of a tube 39. First side 43 is adjacent backside 37 (i.e., more so than is second side 44) of channel region 45. Any other attribute(s) or aspect(s) as shown and/or described herein with respect to other embodiments may be used.

Figure 5:
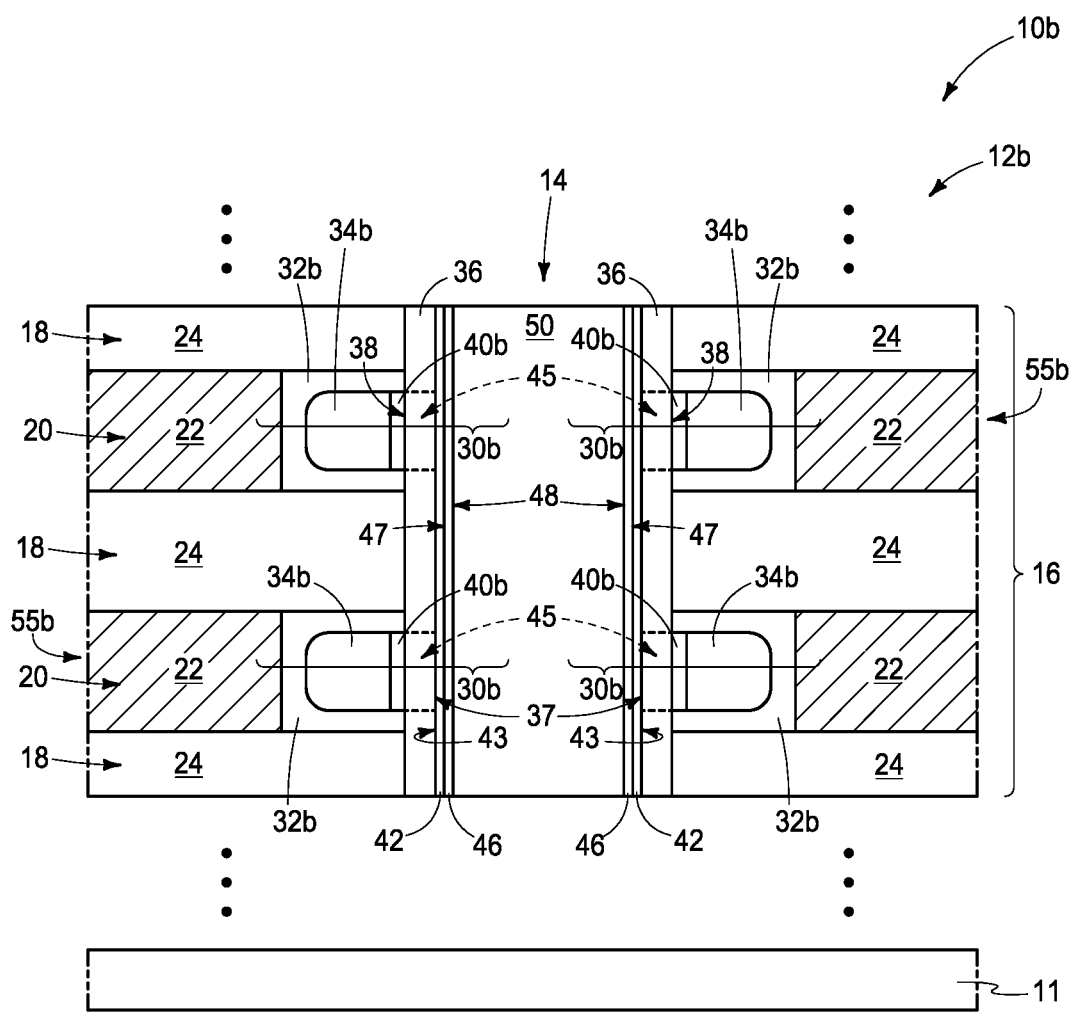
FIG. 5 is a diagrammatic cross-sectional view of a portion of an array of elevationally-extending strings of memory cells in accordance with an embodiment of the invention.

FIG. 5 shows a construction 10*b* illustrating another example embodiment memory array 12*b*. Like numerals from the above-described embodiments have been used where appropriate, with some construction differences being indicated with the suffix "b". Example memory cells 30*b* individually comprise a transistor 55*b*. Example charge-blocking material 32*b*, charge-storage material 34*b*, and gate insulator material 40*b* do not extend all along vertical stack 16 in construction 10*b*. Charge-blocking material 32*b* partially surrounds charge-storage material 34*b*. Any other attribute(s) or aspect(s) as shown and/or described herein with respect to other embodiments may be used.

Figure 6:
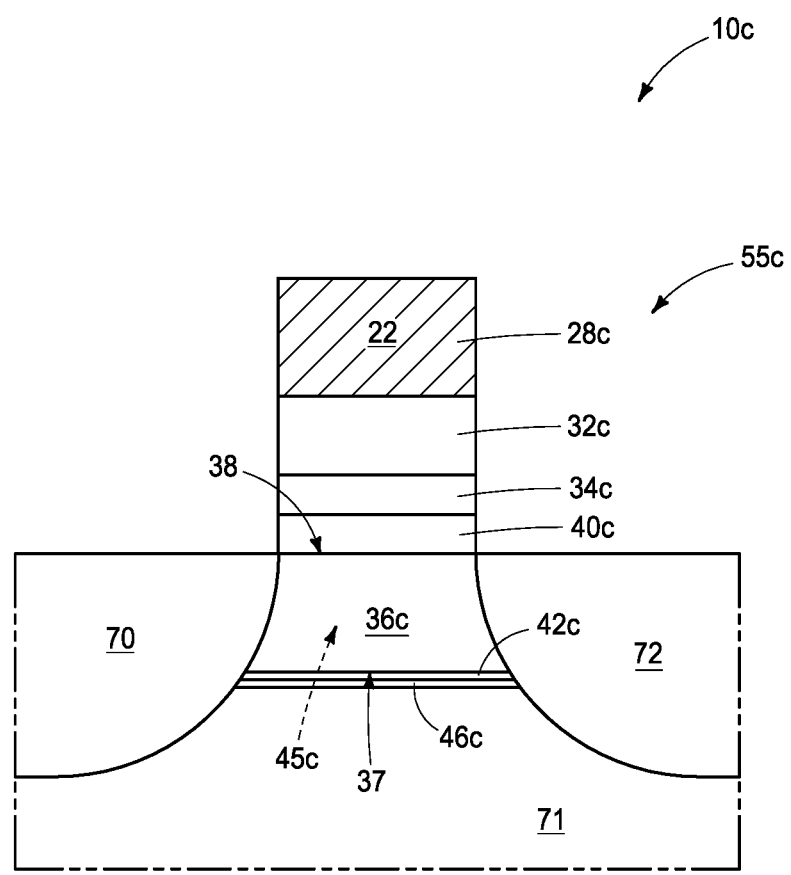
FIG. 6 is a diagrammatic cross-sectional view of a transistor in accordance with an embodiment of the invention.

Transistors 55, 55*a*, and 55*b* are example elevationally-extending transistors and which, in one embodiment, are shown to be vertical or within 10° of vertical. As an alternate example, a transistor may be other than elevationally-extending, for example being a horizontal transistor 55*c* of construction 10*c* as shown in FIG. 6. Like numerals from the above-described embodiments have been used where appropriate, with some construction differences being indicated with the suffix "c" or with different numerals. Transistor 55*c* includes control gate 28*c*, charge-blocking region 32*c*, charge-storage material 34*c*, and insulative-charge passage material 40*c*. A pair of source/drain regions 70 and 72 are within a semiconductor base material 71. A channel region 45*c* comprising channel material 36*c* is within semiconductor base material 71 and between source/drain regions 70 and 72, with channel region 45*c* being under charge-passage material 40*c*. Insulating material 46*c* and insulator material 42*c* are provided as shown. Semiconductor material 71 is shown as bulk material, although alternate constructions may be used (e.g., semiconductor-on-insulator). Any other attribute(s) or aspect(s) as shown and/or described herein with respect to other embodiments may be used (e.g., insulator material 42*c* may not be present [not shown]).

Figure 7:
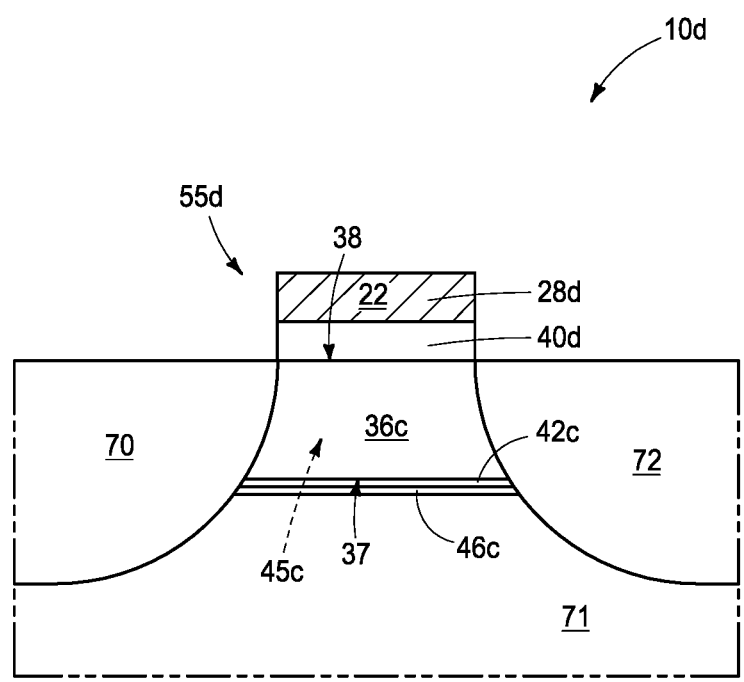
FIG. 7 is a diagrammatic cross-sectional view of a substrate construction in process in accordance with an embodiment of the invention.

Each example transistor 55, 55*a*, 55*b*, and 55*c* as shown and described individually comprise a non-volatile programmable transistor, for example comprising a control gate, a charge-blocking region adjacent the control gate, charge-storage material adjacent the charge-blocking region, and gate insulator between the channel material and the charge-storage material. Embodiments of the invention also encompass a volatile transistor, for example one being devoid of any charge-storage material, and including an array of such transistors. As an example, FIG. 7 shows an alternate embodiment horizontal transistor 55*d* of a construction 10*d*. Like numerals from the above-described embodiments have been used where appropriate, with some construction differences being indicated with the suffix "d". Transistor 55*d* comprises a gate 28*d* (e.g., as part of an access line [not separately shown] interconnecting multiple transistors [not shown] in a row direction [not shown]), and is shown as being devoid of any charge-storage material of the FIGS. 1-6-constructions. Transistor 55*d* may of course be other than horizontally-oriented (not shown). Any other attribute(s) or aspect(s) as shown and/or described herein with respect to other embodiments may be used.

An embodiment of the invention includes an array of transistors, with such transistors individually comprising transistors as described above. An embodiment of the invention includes an array of elevationally-extending strings of memory cells, with such memory cells individually comprising transistors as described above (e.g., with respect to FIGS. 1-5).

It can be advantageous that current flow density be greater in a transistor channel region closer/closest to the gate insulator/tunnel insulator than further/farthest therefrom. Some constructions herein may facilitate such by repelling charge carriers away from those portions of channel regions that are further/farthest from the gate insulator/tunnel insulator and towards such.

Channel regions and/or channel materials extend completely from the edge of one of the source/drain regions of the transistor(s) to the edge of the other source/drain region of the transistor(s), for example as shown in above embodiments.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a transistor comprises a channel region having a frontside and a backside. A gate is adjacent the frontside of the channel region with a gate insulator being between the gate and the channel region. Insulating material having net negative charge is adjacent the backside of the channel region. The insulating material comprises at least one of $Al_xF_y$, $HfAl_xF_y$, $AlO_xN_y$, and $HfAl_xO_yN_z$, where "x", "y", and "z" are each greater than zero.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A transistor comprising:
    a channel region having a frontside and a backside;
    a gate adjacent the frontside of the channel region with a gate insulator being between the gate and the channel region;
    a charge-blocking region adjacent the gate;
    a charge-storage material adjacent the charge-blocking region, the gate insulator being between the channel region and the charge-storage material;
    an insulating material having net negative charge and having a first side and a second side, wherein the second side is opposing the first side and adjacent the backside of the channel region; and
    a dielectric material adjacent the first side of the insulating material.

2. The transistor of claim 1 wherein the insulating material comprises at least one of $Al_xF_y$, $HfAl_xF_y$, $AlO_xN_y$, and $HfAl_xO_yN_z$.

3. The transistor of claim 1 wherein the insulating material comprises each of $Al_xF_y$, $HfAl_xF_y$, $AlO_xN_y$, and $HfAl_xO_yN_z$.

4. The transistor of claim 1 wherein the insulating material is directly against the backside of the channel region.

5. The transistor of claim 1 wherein the insulating material is not directly against the backside of the channel region.

6. The transistor of claim 1 comprising a second insulator material of different composition from that of the insulating material between the insulating material and the backside of the channel region.

7. The transistor of claim 6 wherein the second insulator material comprises at least one of a silicon oxide, silicon oxynitride, and $Al_xO_y$ where "x" and "y" are each greater than zero.

8. The transistor of claim 1 wherein the transistor is horizontal.

9. The transistor of claim 1 wherein the transistor is vertical.

10. An array of elevationally-extending strings of memory cells, each of the memory cells including a transistor comprising:
    a channel region having a frontside and a backside;
    a gate adjacent the frontside of the channel region;
    a gate insulator being between the gate and the channel region;
    a charge-blocking region adjacent the gate;
    charge-storage material adjacent the charge-blocking region, the gate insulator being between the channel region and the charge-storage material;
    an insulating material having net negative charge and having a first side and a second side, wherein the second side is opposing the first side and adjacent the backside of the channel region; and
    a dielectric material adjacent the first side of the insulating material.

11. The array of claim 10 wherein the insulating material is directly against the backside of the channel region.

12. The transistor of claim 10 wherein the insulating material is not directly against the backside of the channel region.

13. The transistor of claim 10 wherein the insulating material comprises at least one of $Al_xF_y$, $HfAl_xF_y$, $AlO_xN_y$, and $HfAl_xO_yN_z$.

14. The array of claim 10 wherein the channel region is comprised by a channel structure that passes through multiple alternating insulative tiers and wordline tiers.

15. The array of claim 14 wherein the gate is configured as an annulus around the channel structure.

16. The array of claim 14 wherein the charge-storage material is comprised by a charge-storage structure that encircles the channel region and extends along multiple of the alternating insulative tiers and wordline tiers.

17. The array of claim 14 wherein the charge-storage material extends only along the wordline tiers.

18. The array of claim 14 wherein the charge-blocking region is comprised by a charge-blocking structure that encircles the channel region and extends along multiple of the alternating insulative tiers and wordline tiers.

19. The array of claim 14 wherein the charge-blocking region comprises charge-blocking material that extends only along the wordline tiers.

* * * * *